United States Patent
Lee et al.

(10) Patent No.: US 11,751,465 B2
(45) Date of Patent: Sep. 5, 2023

(54) MASK FRAME ASSEMBLY AND METHOD OF MANUFACTURING ORGANIC LIGHT-EMITTING DISPLAY APPARATUS USING THE SAME

(71) Applicant: Samsung Display Co., Ltd., Yongin-si (KR)

(72) Inventors: Youngkwang Lee, Yongin-si (KR); Sangyun Lee, Yongin-si (KR); Jaemin Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 111 days.

(21) Appl. No.: 17/131,254

(22) Filed: Dec. 22, 2020

(65) Prior Publication Data
US 2021/0313548 A1     Oct. 7, 2021

(30) Foreign Application Priority Data

Apr. 6, 2020   (KR) ................. 10-2020-0041612

(51) Int. Cl.
  *H01L 51/56*    (2006.01)
  *H10K 71/00*    (2023.01)
  (Continued)

(52) U.S. Cl.
  CPC .......... *H10K 71/00* (2023.02); *C23C 14/042* (2013.01); *C23C 16/042* (2013.01); *H10K 71/166* (2023.02)

(58) Field of Classification Search
  CPC ....... C23C 14/04; C23C 14/042; C23C 16/04; C23C 16/042
  (Continued)

(56) References Cited

U.S. PATENT DOCUMENTS

| 2011/0146573 | A1 | 6/2011 | Park |
| 2011/0220019 | A1 | 9/2011 | Lee et al. |
| 2017/0110661 | A1* | 4/2017 | Lee .................. H10K 71/13 |

FOREIGN PATENT DOCUMENTS

| CN | 107099769 A | * | 8/2017 | ........... C23C 14/042 |
| JP | 2007-270289 A | * | 10/2007 | ............. C23C 14/04 |

(Continued)

OTHER PUBLICATIONS

Machine translation, Wang, Chinese Pat. Pub. No. CN107099769A, translation date: Aug. 9, 2022, Espacenet, all pages. (Year: 2022).*
Machine translation, Hong, Korean Pat. Pub. No. KR2005-0035561A, translation date: Aug. 7, 2022, Espacenet, all pages. (Year: 2022).*

(Continued)

*Primary Examiner* — Victoria K. Hall
(74) *Attorney, Agent, or Firm* — H.C. Park & Associates, PLC (57) ABSTRACT

Provided are a mask frame assembly in which deformation of a frame may be reduced, and a method of manufacturing an organic light-emitting display apparatus using the mask frame assembly. The mask frame assembly includes a frame of a rectangular shape, the frame including an opening and a lower surface including first grooves extending in a first direction, a plurality of first auxiliary sticks extending in the first direction across the opening, wherein a first end and a second end of each of the first auxiliary sticks are bonded to an upper surface of the frame, a mask on the plurality of first auxiliary sticks, and a plurality of second auxiliary sticks arranged in the first grooves, wherein one end and an opposite end of each of the plurality of second auxiliary sticks are bonded to a bottom surface in each of the first grooves.

11 Claims, 8 Drawing Sheets

(51) Int. Cl.
  *C23C 14/04* (2006.01)
  *C23C 16/04* (2006.01)
  *H10K 71/16* (2023.01)

(58) Field of Classification Search
  USPC .................................................. 118/504, 505
  See application file for complete search history.

(56) References Cited

FOREIGN PATENT DOCUMENTS

| | | | | |
|---|---|---|---|---|
| JP | 2007270289 | | 10/2007 | |
| KR | 10-2005-0035561 A | * | 4/2005 | ............ H05B 33/10 |
| KR | 10-0981967 | | 9/2010 | |
| KR | 10-2011-0069466 | | 6/2011 | |
| KR | 10-2011-0101767 | | 9/2011 | |
| KR | 10-2017-0134827 | | 12/2017 | |
| KR | 10-2017-0134827 A | * | 12/2017 | ........... C23C 14/042 |
| KR | 10-2018-0038093 A | * | 4/2018 | ........... C23C 14/042 |

OTHER PUBLICATIONS

Machine translation, Kim, Korean Pat. Pub. No. KR2017-0134827A, translation date: Aug. 7, 2022, Espacenet, all pages. (Year: 2022).*
Machine translation, Soda, Japanese Pat. Pub. No. JP2007-270289A, translation date: Aug. 7, 2022, Espacenet, all pages. (Year: 2022).*
Machine translation, Wang, Chinese Pat. Pub. No. CN107066769A, translation date: Aug. 9, 2022, Espacenet, all pages. (Year: 2022).*
English Translation, Wang, Chinese Pat. Pub. No. CN107099769A, translation date: Feb. 27, 2023, U.S. Patent & Trademark Office Translations Service Center, all pages. (Year: 2023).*
English translation, Wang, Chinese Pat. Pub. No. CN107099769A, translation date: Feb. 27, 2023, U.S. Patent & Trademark Translations Service Center, all pages. (Year: 2023).*
Machine translation, Park, Korean Pat. Pub. No. KR2018-0038093A, translation date: Aug. 10, 2022, Espacenet, all pages. (Year: 2022).*

* cited by examiner

MASK FRAME ASSEMBLY AND METHOD OF MANUFACTURING ORGANIC LIGHT-EMITTING DISPLAY APPARATUS USING THE SAME

CROSS-REFERENCE TO RELATED APPLICATION

This application claims priority from and the benefit of Korean Patent Application No. 10-2020-0041612, filed on Apr. 6, 2020, which is hereby incorporated by reference for all purposes as if fully set forth herein.

BACKGROUND

Field

Exemplary embodiments and implementations of the invention relate to a mask frame assembly and a method of manufacturing an organic light-emitting display apparatus using the mask frame assembly, and more particularly, to a mask frame assembly in which deformation of a frame may be reduced, and a method of manufacturing an organic light-emitting display apparatus using the mask frame assembly.

Discussion of the Background

In general, when manufacturing a display apparatus, e.g., an organic light-emitting display apparatus, etc., various layers are formed by a deposition method. For example, in the case of an organic light-emitting display apparatus, a hole injection layer, a hole transport layer, an emission layer, an electron transport layer, an electron injection layer, etc. are formed on a substrate by using a deposition apparatus during manufacturing processes of the organic light-emitting display apparatus. During this process, a material is deposited on a preset portion of a substrate by using a mask.

However, in the case of using a mask frame assembly in a deposition process, a frame may be easily deformed.

The above information disclosed in this Background section is only for understanding of the background of the inventive concepts, and, therefore, it may contain information that does not constitute prior art.

SUMMARY

One or more embodiments include a mask frame assembly in which deformation of a frame may be reduced, and a method of manufacturing an organic light-emitting display apparatus using the mask frame assembly. However, the above technical features are exemplary, and the scope of the disclosure is not limited thereto.

Additional aspects will be set forth in part in the description which follows and, in part, will be apparent from the description, or may be learned by practice of the presented embodiments of the disclosure.

According to one or more embodiments, a mask frame assembly includes a frame of a rectangular shape, the frame including an opening and a lower surface, the lower surface including first grooves defined in the lower surface and extending in a first direction, a plurality of first auxiliary sticks extending in the first direction across the opening, wherein a first end and a second end of each of the first auxiliary sticks are bonded to an upper surface of the frame, a mask over the plurality of first auxiliary sticks, and a plurality of second auxiliary sticks in the first grooves, wherein a third end and a fourth end of each of the plurality of second auxiliary sticks are bonded to a bottom surface of the first grooves.

A depth of each of the first grooves may be greater than a thickness of each of the plurality of second auxiliary sticks.

The number of the plurality of first auxiliary sticks may be greater than the number of the plurality of second auxiliary sticks, and a width of each of the plurality of second auxiliary sticks may be greater than a width of each of the plurality of first auxiliary sticks.

The number of the plurality of first auxiliary sticks may be greater than the number of the plurality of second auxiliary sticks, and a thickness of each of the plurality of second auxiliary sticks may be greater than a thickness of each of the plurality of first auxiliary sticks.

The number of the plurality of first auxiliary sticks may be greater than the number of the first grooves, and two or more second auxiliary sticks among the plurality of second auxiliary sticks may be stacked in each of the first grooves.

The first end and the second end of each of the plurality of first auxiliary sticks may be bonded to an upper surface of the frame in a state in which a tensile force is applied to each of the plurality of first auxiliary sticks, the third end and the fourth end of each of the plurality of second auxiliary sticks may be bonded to a bottom surface of the first grooves in a state in which a tensile force is applied to each of the plurality of second auxiliary sticks, the number of the plurality of first auxiliary sticks may be greater than the number of the plurality of second auxiliary sticks, and the tensile force applied to each of the plurality of second auxiliary sticks may be greater than the tensile force applied to each of the plurality of first auxiliary sticks.

The mask may include a plurality of mask sticks extending in a second direction that crosses the first direction.

The frame may have second grooves defined in a lower surface thereof, the second grooves extending in a second direction that crosses the first direction, and the mask frame assembly may further include a plurality of third auxiliary sticks extending in a second direction across the opening, wherein a fifth end and a sixth end of each of the third auxiliary sticks are bonded to an upper surface of the frame, and a plurality of fourth auxiliary sticks in the second grooves, wherein a seventh end and an eighth end of each of the plurality of fourth auxiliary sticks may be bonded to a bottom surface of the second grooves.

A depth of each of the second grooves may be greater than a thickness of each of the plurality of fourth auxiliary sticks.

The number of the plurality of third auxiliary sticks may be greater than the number of the plurality of fourth auxiliary sticks, and a width of each of the plurality of fourth auxiliary sticks may be greater than a width of each of the plurality of third auxiliary sticks.

The number of the plurality of third auxiliary sticks may be greater than the number of the plurality of fourth auxiliary sticks, and a thickness of each of the plurality of fourth auxiliary sticks may be greater than a thickness of each of the plurality of third auxiliary sticks.

The number of the plurality of third auxiliary sticks may be greater than the number of the second grooves, and two or more fourth auxiliary sticks among the plurality of fourth auxiliary sticks may be stacked in each of the second grooves.

The fifth and the sixth end of each of the plurality of third auxiliary sticks may be bonded to an upper surface of the frame in a state in which a tensile force is applied to each of the plurality of third auxiliary sticks, the seventh end and the eighth end of each of the plurality of fourth auxiliary sticks may be bonded to a bottom surface of the second grooves in a state in which a tensile force is applied to each of the plurality of fourth auxiliary sticks, the number of the plurality of third auxiliary sticks may be greater than the number of the plurality of fourth auxiliary sticks, and the tensile force applied to each of the plurality of fourth auxiliary sticks may be greater than the tensile force applied to each of the plurality of third auxiliary sticks.

The plurality of first auxiliary sticks and the plurality of third auxiliary sticks may be bonded to each other at intersecting points therebetween.

The mask may include a plurality of mask sticks extending in the second direction.

The opening may have a rectangular shape having long sides and short sides, and the first direction may be parallel with the long sides of the opening.

According to one or more embodiments, a method of manufacturing an organic light-emitting display apparatus includes preparing a substrate, forming pixel electrodes on the substrate, and forming an intermediate layer on the pixel electrodes by using the mask frame assembly described above.

Other aspects, features and advantages of the disclosure will become better understood through the accompanying drawings, the claims and the detailed description.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

The above and other aspects, features, and advantages of certain embodiments of the disclosure will be more apparent from the following description taken in conjunction with the accompanying drawings, in which.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or a layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the v-axis, and the z-axis are not limited to three axes of a rectangular coordinate system, and may be interpreted in a broader sense. For example, the x-axis, the v-axis, and the x-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

[Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the inventive concepts allow for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The example embodiments will be described below in more detail with reference to the accompanying drawings. Those components that are the same or are in correspondence are rendered the same reference numeral regardless of the figure number, and redundant explanations are omitted.

It will be understood that when an element such as a layer, film, region or substrate is referred to as being placed "on" another element, it can be directly placed on the other element, or an intervening layer(s) may also be present. Sizes of components in the drawings may be exaggerated for convenience of explanation. In other words, because sizes and thicknesses of components in the drawings are arbitrarily illustrated for convenience of explanation, the following embodiments are not limited thereto.

Figure 1:
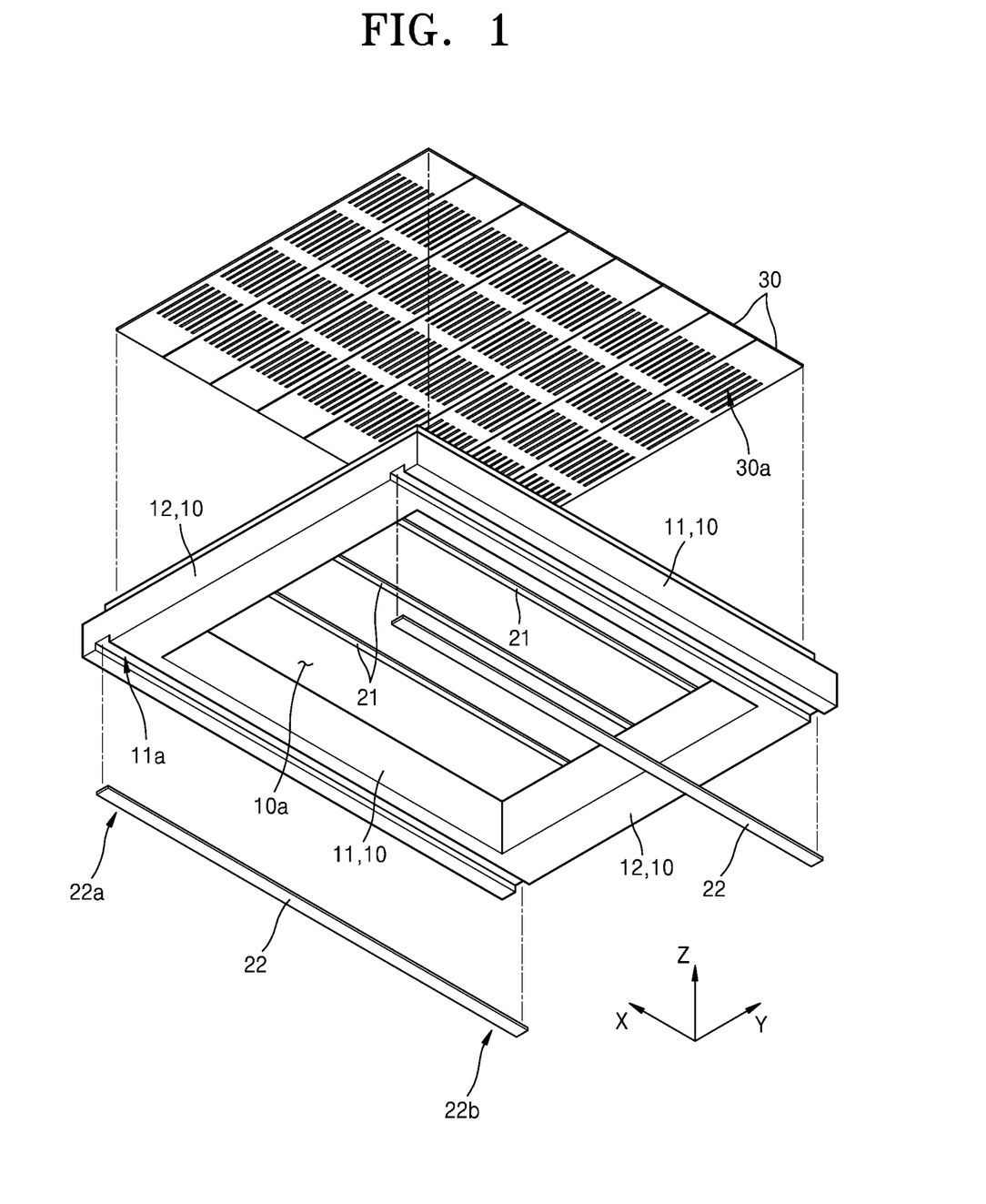
FIG. 1 is a bottom perspective view illustrating a mask frame assembly according to an embodiment.

FIG. 1 is a bottom perspective view illustrating a mask frame assembly according to an embodiment. As illustrated in FIG. 1, the mask frame assembly according to the embodiment includes a frame 10, first auxiliary sticks 21, second auxiliary sticks 22, and a mask including a plurality of mask sticks 30.

The frame 10 has an opening 10a of a rectangular shape, and the frame 10 itself may also have a rectangular shape. That is, the frame 10 may include two first sides 11 facing each other and two second sides 12 facing each other. The frame 10 has an upper surface (in +z direction) and a lower surface (in −z direction), and includes first grooves 11a extending in a first direction (x-axis direction) in the lower surface. In FIG. 1, the frame 10 includes the first grooves 11a extending in the first direction (x-axis direction) in the lower surface of each of the two first sides 11. The frame 10 may include Invar, that is, an Fe—Ni alloy, and a thickness of the frame 10 (in a z-axis direction) is about 30 mm. In this case, the first groove 11a may have a depth of about 500 μm.

The plurality of first auxiliary sticks 21 extend in the first direction (x-axis direction) to cross the opening 10a of the frame 10. In each of the plurality of first auxiliary sticks 21, an end (in the +x direction) and an opposite end (in the −x direction) may be coupled to the upper surface of the frame 10 by various methods, e.g., welding, etc. As described above, when each of the plurality of first auxiliary sticks 21 is fixed to the upper surface of the frame 10, a tensile force is applied in a lengthwise direction (x-axis direction) of the first auxiliary stick 21. Accordingly, sagging (in −z direction) of a center portion of the first auxiliary stick 21 after the fixing operation may be reduced. In FIG. 1, one end and the opposite end of each of the plurality of first auxiliary sticks 21 are fixed to the upper surfaces of the second sides 12 of the frame 10. The first auxiliary sticks 21 may include SUS that is a kind of stainless steel and may have a thickness (in the z-axis direction) of about 100 μm.

The mask may be disposed on the plurality of first auxiliary sticks 21. As illustrated in FIG. 1, the mask may include the plurality of mask sticks 30 extending in the second direction (y-axis direction) intersecting the first direction (x-axis direction). An end (in the +y direction) and the opposite end (in the −y direction) in each of the mask sticks 30 may be coupled to the upper surface of the frame 10 by various methods, e.g., welding, etc. The mask sticks 30 may include SUS.

When each of the plurality of mask sticks 30 is fixed to the upper surface of the frame 10, a tensile force is applied in the lengthwise direction (y-axis direction) of the mask sticks 30. Accordingly, sagging (in the −z direction) of a center portion of the mask stick 30 after the fixing operation may be reduced. Also, because a weight of the mask sticks 30 is relatively smaller than that of one large mask sheet corresponding to entire opening 10a of the frame 10, sagging of the mask sticks 30 due to the weight of itself may be reduced.

Moreover, because there are the plurality of first auxiliary sticks 21 under the mask sticks 30, wherein the first auxiliary sticks 21 are extended by the tensile force applied in the first direction (x-axis direction) intersecting the direction (y-axis direction) in which the mask sticks 30 extend, the first auxiliary sticks 21 support the mask sticks 30 and reduce the sagging of the center portions of the mask sticks 30 in the −z direction due to gravity. As illustrated in FIG. 1, one end and an opposite end of each of the mask sticks 30 are fixed on the upper surfaces of the first sides 11 of the frame 10. The mask sticks 30 are supported by the first auxiliary sticks 21 each having the one end and the opposite end fixed on the upper surface of the second sides 12 and extending to cross the mask sticks 30 respectively.

In addition, as illustrated in FIG. 1, when the opening 10a of the frame 10 has a rectangular shape having long sides and short sides, the first direction (x-axis direction) in which the first auxiliary sticks 21 extend may be in parallel with the long sides of the opening 10a. As described above, the first auxiliary sticks 21 prevent the mask sticks 30 from sagging due to gravity. In order to reduce the sagging of the mask sticks 30 due to gravity, the mask sticks 30 may have relatively smaller lengths than the long sides of the frame 10. Therefore, the mask sticks 30 may extend in a direction parallel to the short side, between the long and short sides of the opening 10a in the frame 10. To this end, the first direction (x-axis direction) in which the first auxiliary sticks 21 supporting the mask sticks 30 extend may be in parallel with the long sides of the opening 10a.

Each of the mask sticks 30 includes a plurality of slits 30a such that a deposition material may be deposited on a substrate (not illustrated) through the slits 30a. A width or a length of each slit 30a may vary depending on a size or a detailed structure of the organic light-emitting display apparatus that is to be manufactured.

One or more embodiments are not limited thereto, that is, the mask may not include the plurality of mask sticks 30, but may include a mask sheet that is provided in a single body. In this case, the mask sheet of a single body may have a rectangular shape in a plan view (seen from the z-axis direction), and four sides of the mask sheet may be fixed to the upper surfaces of the two first sides 11 and the upper surfaces of the two second sides 12 in the frame 10 by various methods, e.g., welding, etc. The mask sheet of the single body may partially sag due to the weight of itself, but in the mask frame assembly according to the embodiment, the first auxiliary sticks 21 support the mask sheet, and thus, the sagging of the mask sheet due to the weight may be reduced.

Unlike the first auxiliary sticks 21 crossing the opening 10a of the frame 10, the second auxiliary sticks 22 are disposed in the first grooves 11a that are formed in the lower surfaces of the first sides 11 of the frame 10. In addition, an end 22a (in +x direction) and an opposite end 22b (in −x direction) in each of the second auxiliary sticks 22 may be bonded to bottom surfaces of the first grooves 11a by various methods, e.g. welding, etc. When each of the second auxiliary sticks 22 is fixed in the first groove 11a formed in the lower surface of the first side 11 of the frame 10, a tensile force is applied in the lengthwise direction (x-axis direction) of the second auxiliary stick 22 to fix the second auxiliary stick 22. The second auxiliary sticks 22 may include SUS that is a kind of stainless steel and may have a thickness (in the z-axis direction) of about 100 μm.

Figure 2:
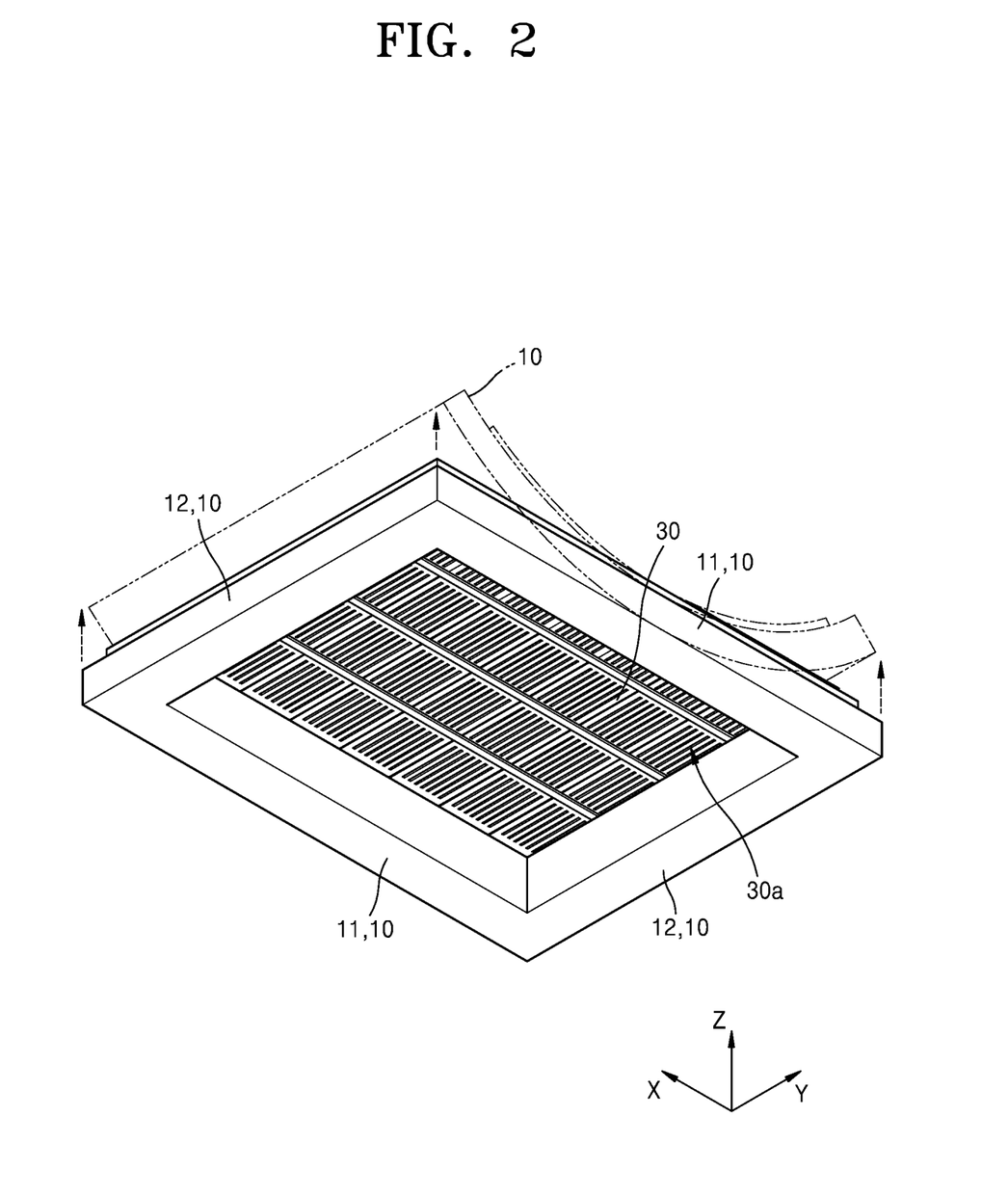
FIG. 2 is a bottom perspective view illustrating a mask frame assembly according to a comparative example.

FIG. 2 is a bottom perspective view illustrating a mask frame assembly according to a comparative example, wherein the mask frame assembly does not include the second auxiliary sticks 22. As described above, because there are the plurality of first auxiliary sticks 21 that extend by the tensile force applied thereto in the first direction (x-axis direction), when the mask frame assembly is used, the frame 10 may be deformed by the tensile force of the first auxiliary sticks 21 according to time. Because the first auxiliary sticks 21 are fixed on the upper surfaces of the second sides 12 of the frame 10 in a state of being applied by the tensile force, the first sides 11 of the frame 10 are curved and the second sides 12 of the frame 10 are lifted (in +z direction) in FIG. 2.

However, in the mask frame assembly according to the embodiment, the deformation of the frame 10 may be prevented or reduced. As described above, the mask frame assembly according to the embodiment includes the second auxiliary sticks 22, and unlike the first auxiliary sticks 21 on the upper surface of the frame 10, the second auxiliary sticks 22 are in the first grooves 11a formed in the lower surfaces of the first sides 11 of the frame 10. In addition, each of the second auxiliary sticks 22 is fixed in the first groove 11a in a state in which the tensile force is applied in the lengthwise direction (x-axis direction) of the second auxiliary stick 22. Therefore, the force applied to the frame 10 due to the tensile force applied to the first auxiliary sticks 21 is at least partially offset by the tensile force applied to the second auxiliary sticks 22. Therefore, the deformation of the frame 10 as illustrated in FIG. 2 may be prevented or reduced.

A depth of each first groove 11a formed in the lower surface of the first side 11 of the frame 10 may be greater than a thickness of each of the plurality of second auxiliary sticks 22 that are to be embedded in the first grooves 11a. Accordingly, each of the plurality of second auxiliary sticks 22 may not protrude out of the lower surface of the first side 11 of the frame 10.

In order to perform deposition by using the mask frame assembly during manufacturing processes of the organic light-emitting display apparatus, the mask frame assembly is conveyed into a deposition chamber and is returned from the deposition chamber after the deposition is finished. Any deposition material, etc. stuck to the mask frame assembly may be removed. When each of the second auxiliary sticks 22 at least partially protrudes out of the lower surface of the first side 11 of the frame 10, the second auxiliary sticks 22 may be damaged during the processes of conveying and handling the mask frame assembly as noted above. However, in the mask frame assembly according to the embodiment, because each of the plurality of second auxiliary sticks 22 does not protrude from the lower surface of the first side 11 of the frame 10, damage to the second auxiliary sticks 22 during utilization of the mask frame assembly may be effectively prevented.

In addition, the plurality of second auxiliary sticks 22 are in the first grooves 11a that are formed in the lower surfaces of the first sides 11 of the frame 10, and thus, there is a limitation in increasing the number of the second auxiliary sticks 22. On the other hand, because the plurality of first auxiliary sticks 21 are on the upper surface of the frame 10 while crossing the opening 10a of the frame 10, the number of first auxiliary sticks 21 may be easily increased as compared with the second auxiliary sticks 22. In FIG. 1, the number of the first auxiliary sticks 21 is greater than that of the second auxiliary sticks 22. In the above situation, in order to prevent the deformation of the frame 10 due to the tensile force applied to the first auxiliary sticks 21 by using the tensile force applied to the second auxiliary sticks 22, a tensile force applied to each of the second auxiliary sticks 22 may be greater than that applied to each of the first auxiliary sticks 21. For example, the tensile force applied to each of the first auxiliary sticks 21 may be about 10 kgf, and the tensile force applied to each of the second auxiliary sticks 22 may be about 30 kgf.

Here, a width of each of the second auxiliary sticks 22 (in the y-axis direction) may be greater than that of each of the first auxiliary sticks 21 (in the y-axis direction). Thus, damage to the second auxiliary sticks 22 when the tensile force applied to each second auxiliary stick 22 is greater than that applied to each first auxiliary stick 21 may be prevented.

Figure 3:
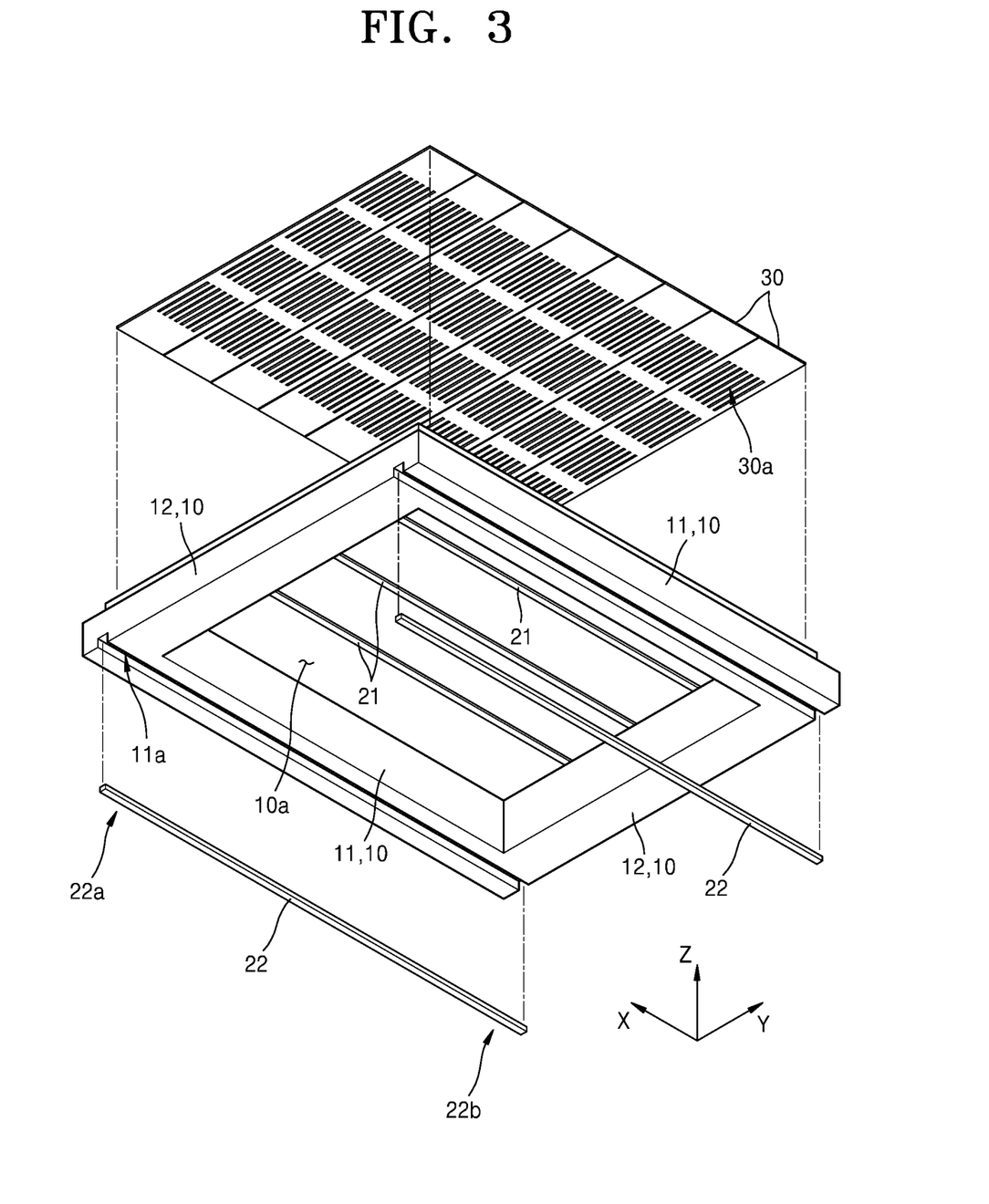
FIG. 3 is a bottom perspective view illustrating a mask frame assembly according to another embodiment.

FIG. 3 is a bottom perspective view illustrating a mask frame assembly according to another embodiment. As illustrated in FIG. 3, a thickness of each second auxiliary stick 22 (in the z-axis direction) may be greater than that of each first auxiliary stick 21 (in the z-axis direction). As such, even when the tensile force applied to each of the second auxiliary sticks 22 is greater than that applied to each of the first auxiliary sticks 21 because the number of the first auxiliary sticks 21 is greater than the number of the second auxiliary sticks 22, damage to the second auxiliary sticks 22 may be prevented. The width of each of the plurality of second auxiliary sticks 22 (in the y-axis direction) may be greater than that of each of the plurality of first auxiliary sticks 21 (in the y-axis direction), and at the same time, the thickness of each second auxiliary stick 22 (in the z-axis direction) may be greater than that of each first auxiliary stick 21 (in the z-axis direction).

Figure 4:
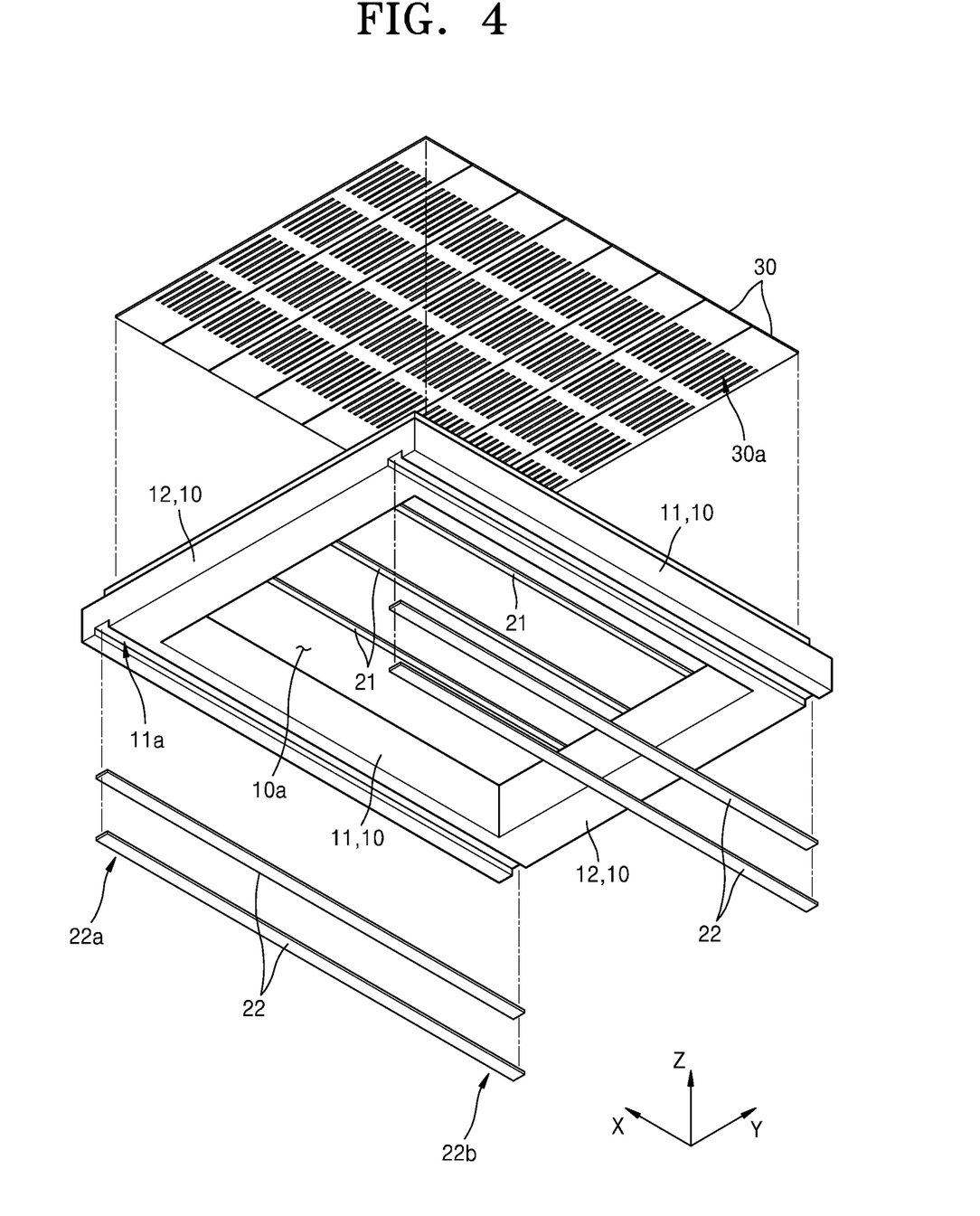
FIG. 4 is a bottom perspective view illustrating a mask frame assembly according to another embodiment.

FIG. 4 is a bottom perspective view illustrating a mask frame assembly according to another embodiment. In the mask frame assembly according to the embodiment, the number of the plurality of first auxiliary sticks 21 is greater than the number of first grooves 11a formed in the lower surfaces of the first sides 11 of the frame 10. However, two or more second auxiliary sticks 22 are stacked in each of the first grooves 11a. Accordingly, the number of the first grooves 11a formed in the lower surfaces of the first sides 11 of the frame 10 is smaller than that of the plurality of first auxiliary sticks 21, but the total number of the plurality of second auxiliary sticks 22 located in the first grooves 11a may be similar to that of the plurality of first auxiliary sticks 21. As such, the deformation of the frame 10 may be effectively prevented. In this case, the size of the tensile force applied to each of the plurality of second auxiliary sticks 22 may be similar to that of the tensile force applied to each of the plurality of first auxiliary sticks 21.

Figure 5:
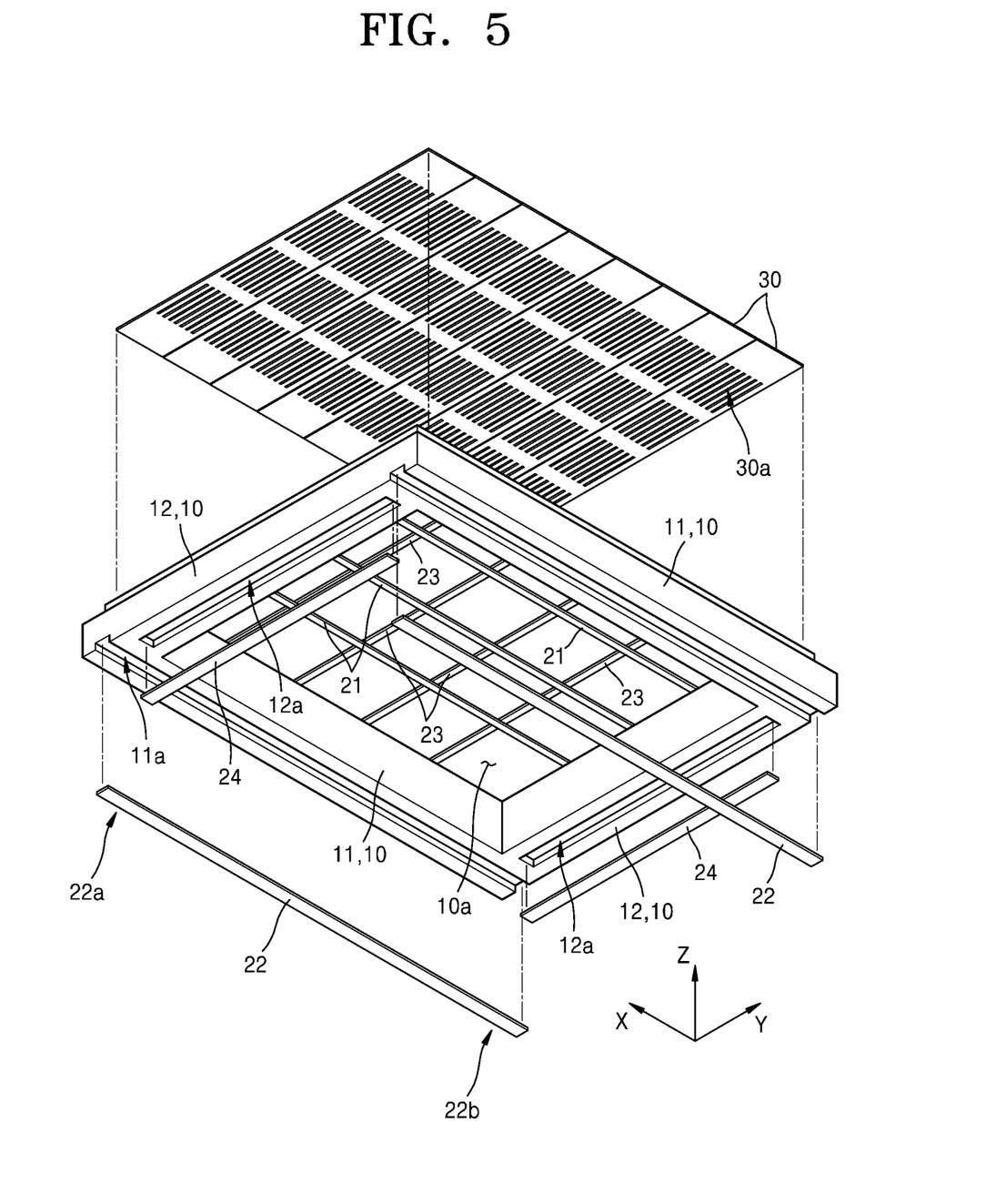
FIG. 5 is a bottom perspective view illustrating a mask frame assembly according to another embodiment.

FIG. 5 is a bottom perspective view illustrating a mask frame assembly according to another embodiment. The mask frame assembly according to the embodiment further includes a plurality of third auxiliary sticks 23 and a plurality of fourth auxiliary sticks 24.

The plurality of third auxiliary sticks 23 extend in the second direction (y-axis direction) so as to cross the opening 10a of the frame 10, and one end (in the +y direction) and an opposite end (in the -y direction) in each of the third auxiliary sticks 23 may be bonded to the upper surfaces of the first sides 11 of the frame 10 in various ways, e.g., welding, etc. As described above, when each of the plurality of third auxiliary sticks 23 is fixed to the upper surface of the frame 10, a tensile force is applied in a lengthwise direction (y-axis direction) of the third auxiliary stick 23. Accordingly, sagging (in the -z direction) of a center portion of the third auxiliary stick 23 after the fixing operation may be reduced. In FIG. 5, one end and the opposite end of each of the plurality of third auxiliary sticks 23 are fixed to the upper surfaces of the first sides 11 of the frame 10. Accordingly, the mask including the mask sheet or the mask sticks 30 may be on the plurality of first auxiliary sticks 21 and the plurality of third auxiliary sticks 23. The third auxiliary stick 23 may include SUS, and a thickness of the third auxiliary stick 23 (in the z-axis direction) may be about 100 μm.

As a reference, the plurality of first auxiliary sticks 21 and the plurality of third auxiliary sticks 23 are all on the upper surface of the frame 10. Therefore, the plurality of first auxiliary sticks 21 and the plurality of third auxiliary sticks 23 cross each other. In addition, the plurality of first auxiliary sticks 21 and the plurality of third auxiliary sticks 23 may be bonded to each other at intersecting points therebetween by the method such as welding, etc.

Unlike the third auxiliary sticks 23 crossing the opening 10a of the frame 10, the fourth auxiliary sticks 24 are in second grooves 12a formed in lower surfaces of the second sides 12 of the frame 10. In addition, an end (in the +y direction) and an opposite end (in the -y direction) of each of the fourth auxiliary sticks 24 are bonded to bottom surfaces of the second grooves 12a by various methods, e.g., welding, etc. When each of the fourth auxiliary sticks 24 is fixed in the second groove 12a formed in the lower surface of the second side 12 of the frame 10, a tensile force is applied in the lengthwise direction (y-axis direction) of the fourth auxiliary stick 24. The fourth auxiliary stick 24 may include SUS, and a thickness of the fourth auxiliary stick 24 (in the z-axis direction) may be about 100 μm.

The mask frame assembly according to the embodiment includes the third auxiliary sticks 23 in addition to the first auxiliary sticks 21, and thus, the mask sheet or the mask sticks 30 may be firmly supported. In addition, the mask frame assembly according to the embodiment includes the fourth auxiliary sticks 24 in addition to the third auxiliary sticks 23, and thus, deformation of the frame 10 due to the first auxiliary sticks 21 or the third auxiliary sticks 23 may be effectively prevented or reduced.

A depth of each second groove 12a formed in the lower surface of the second side 12 of the frame 10 may be greater than a thickness of each of the plurality of fourth auxiliary sticks 24 that are to be embedded in the second grooves 12a. Accordingly, each of the plurality of fourth auxiliary sticks 24 may not protrude out of the lower surface of the second side 12 of the frame 10. As described above, in the mask frame assembly according to the embodiment, because each of the plurality of fourth auxiliary sticks 24 does not protrude from the lower surface of the second side 12 of the frame 10, damage to the fourth auxiliary sticks 24 during utilization of the mask frame assembly may be effectively prevented.

In addition, the plurality of fourth auxiliary sticks 24 are in the second grooves 12a that are formed in the lower surfaces of the second sides 12 of the frame 10, and thus, there is a limitation in increasing the number of the fourth auxiliary sticks 24. On the other hand, because the plurality of third auxiliary sticks 23 are on the upper surface of the frame 10 while crossing the opening 10a of the frame 10, the number of third auxiliary sticks 23 may be easily increased as compared with the fourth auxiliary sticks 24. In FIG. 5, the number of the third auxiliary sticks 23 is greater than that of the fourth auxiliary sticks 24. In the above situation, in order to prevent the deformation of the frame 10 due to the tensile force applied to the third auxiliary sticks 23 by using the tensile force applied to the fourth auxiliary sticks 24, a tensile force applied to each of the fourth auxiliary sticks 24 may be greater than that applied to each of the third auxiliary sticks 23.

Here, a width of each of the fourth auxiliary sticks 24 (in x-axis direction) may be greater than that of each of the third auxiliary sticks 23 (in x-axis direction). Thus, damage to the fourth auxiliary sticks 24 when the tensile force applied to each fourth auxiliary stick 24 is greater than that applied to each third auxiliary stick 23 may be prevented.

Figure 6:
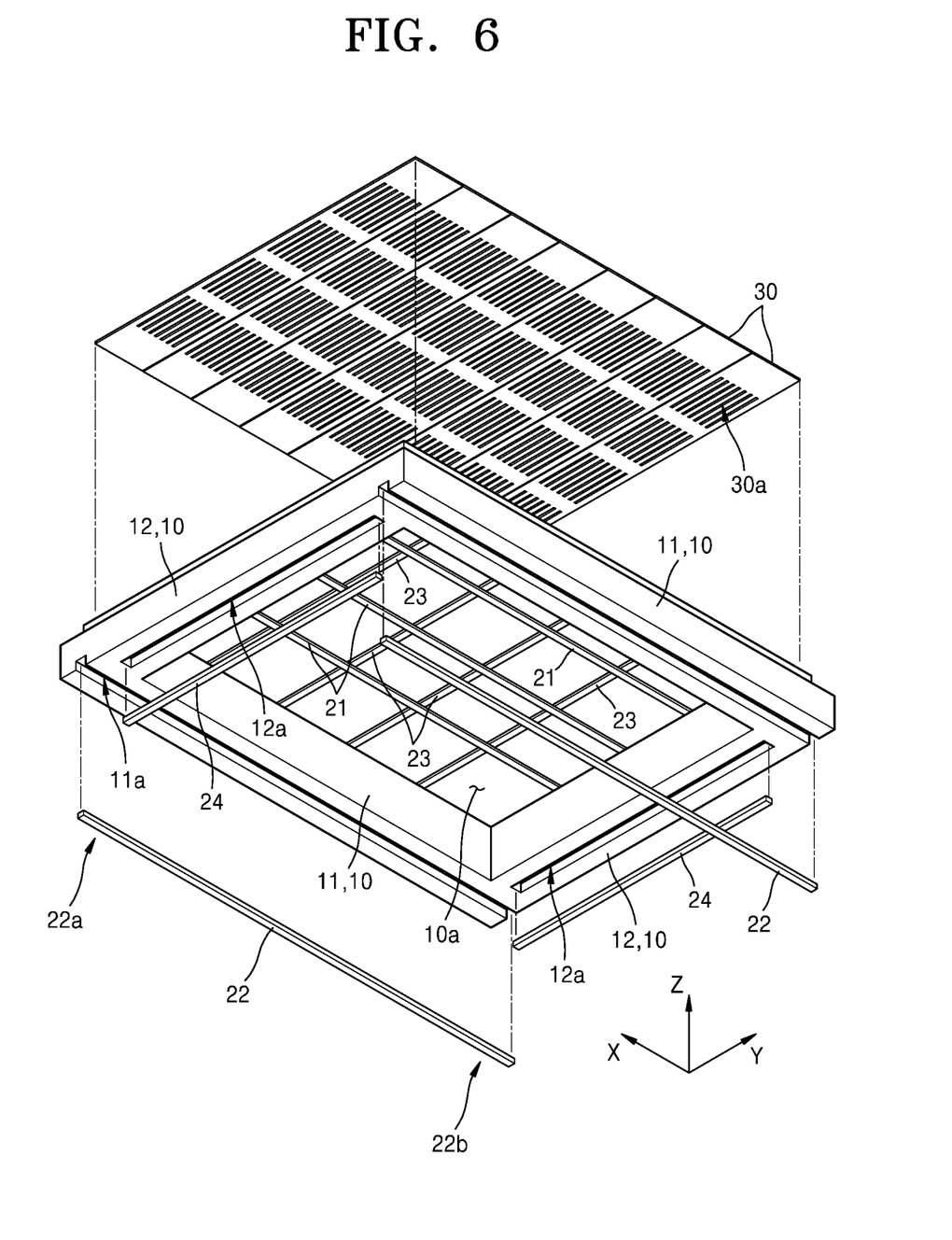
FIG. 6 is a bottom perspective view illustrating a mask frame assembly according to another embodiment.

FIG. 6 is a bottom perspective view illustrating a mask frame assembly according to another embodiment. In FIG. 6, a thickness of each fourth auxiliary stick 24 (in the z-axis direction) may be greater than that of each third auxiliary stick 23 (in the z-axis direction). As such, even when the tensile force applied to each of the fourth auxiliary sticks 24 is greater than that applied to each of the third auxiliary sticks 23 because the number of the third auxiliary sticks 23 is greater than the number of the fourth auxiliary sticks 24, damage to the fourth auxiliary sticks 24 may be prevented. The width of each of the plurality of fourth auxiliary sticks 24 (in the x-axis direction) may be greater than that of each of the plurality of third auxiliary sticks 23 (in the x-axis direction), and at the same time, the thickness of each fourth auxiliary stick 24 (in the z-axis direction) may be greater than that of each third auxiliary stick 23 (in the z-axis direction).

Figure 7:
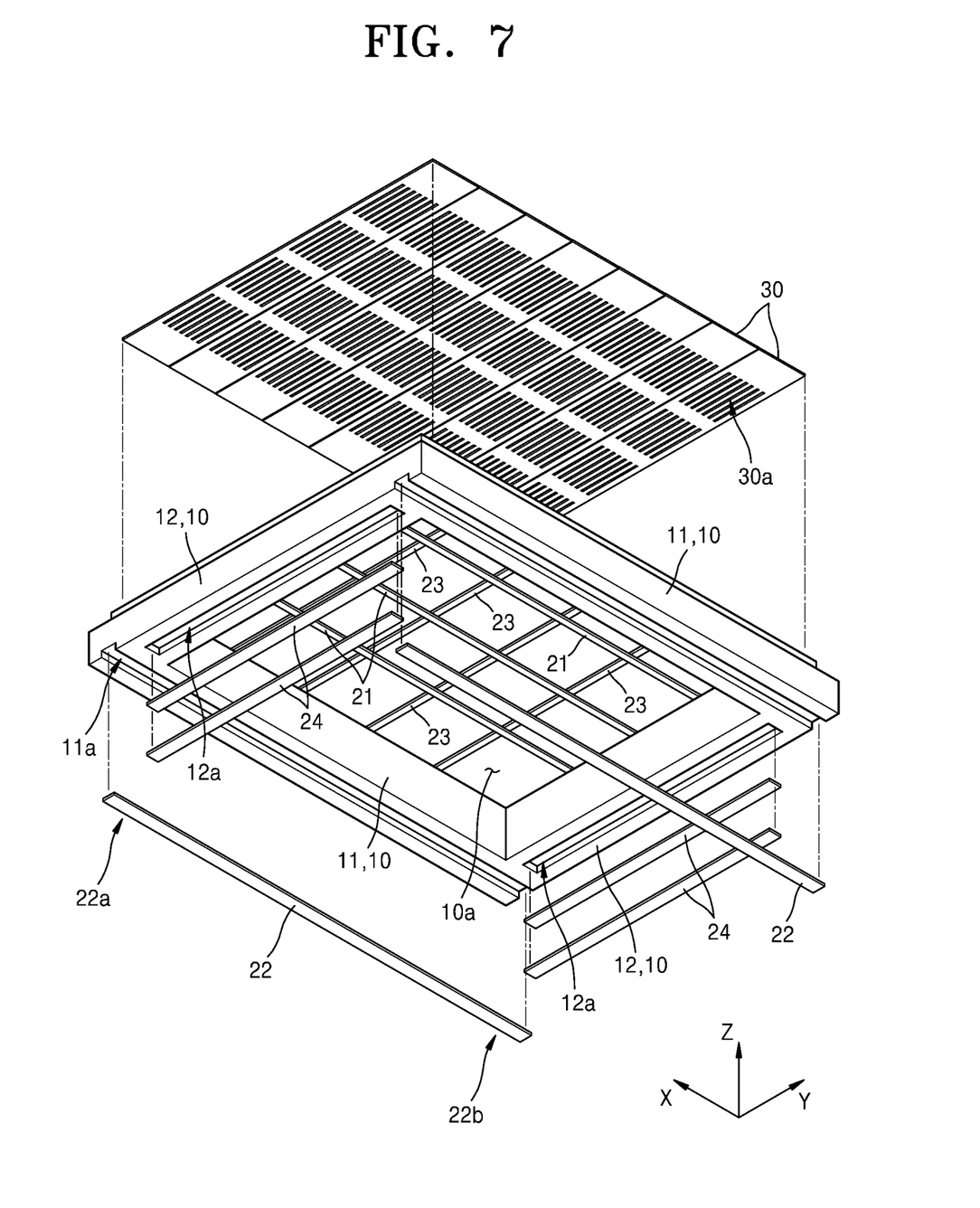
FIG. 7 is a bottom perspective view illustrating a mask frame assembly according to another embodiment.

FIG. 7 is a bottom perspective view illustrating a mask frame assembly according to another embodiment. In the mask frame assembly according to the embodiment, the number of the plurality of third auxiliary sticks 23 is greater than the number of second grooves 12a formed in the lower surfaces of the second sides 12 of the frame 10. However, two or more fourth auxiliary sticks 24 are stacked in each of the second grooves 12a. Accordingly, the number of the second grooves 12a formed in the lower surfaces of the second sides 12 of the frame 10 is smaller than that of the plurality of third auxiliary sticks 23, but the total number of the plurality of fourth auxiliary sticks 24 located in the second grooves 12a may be similar to that of the plurality of third auxiliary sticks 23. As such, the deformation of the frame 10 may be effectively prevented. In this case, the size of the tensile force applied to each of the plurality of fourth auxiliary sticks 24 may be similar to that of the tensile force applied to each of the plurality of third auxiliary sticks 23.

The mask frame assembly has been described, but the disclosure is not limited thereto. A method of manufacturing an organic light-emitting display apparatus by using the mask frame assembly and the organic light-emitting display apparatus manufactured thereby may be also included in the scope of the disclosure.

Figure 8:
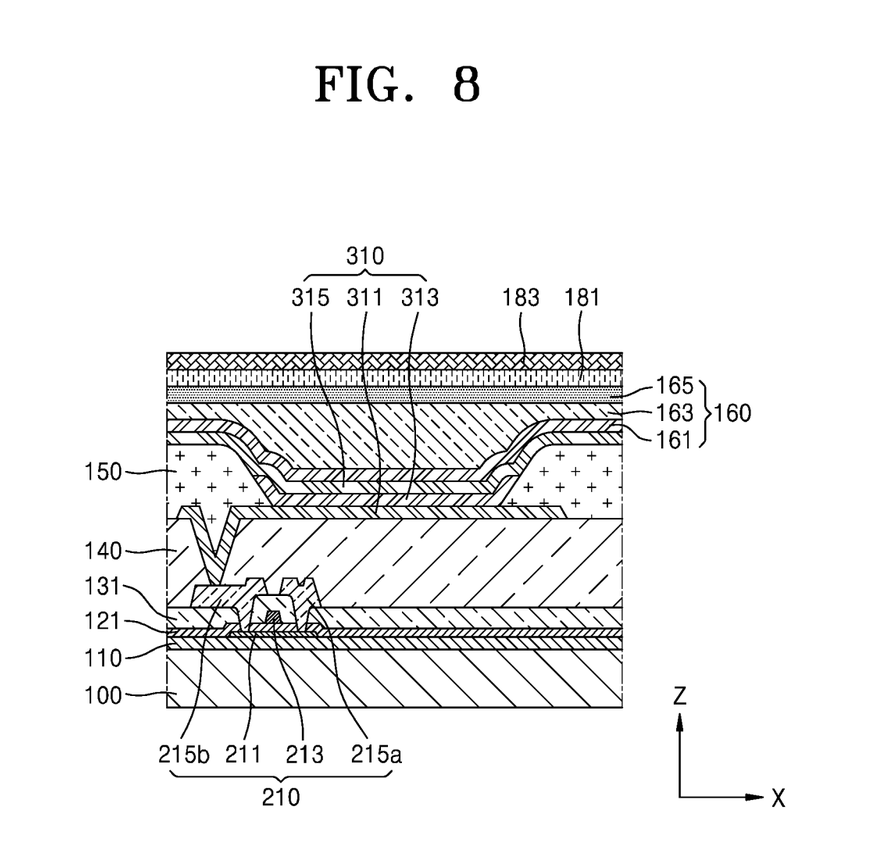
FIG. 8 is a cross-sectional view illustrating a portion of an organic light-emitting display apparatus manufactured by a method of manufacturing an organic light-emitting display apparatus according to an embodiment.

FIG. 8 is a cross-sectional view illustrating a portion of an organic light-emitting display apparatus manufactured by a method of manufacturing an organic light-emitting display apparatus according to an embodiment.

A substrate 100 is prepared. The substrate 100 may include glass, metal, or a polymer resin. When the substrate 100 is flexible or bendable, the substrate 100 may include a polymer resin such as a polyethersulfone, polyacrylate, polyetherimide, polyethylene naphthalate, polyethylene terephthalate, polyphynylene sulfide, polyarylate, polyimide, polycarbonate, or cellulose acetate propionate. The substrate 100 may be variously modified, for example, the substrate 100 may have a multi-layered structure including two layers each having a polymer resin and a barrier layer including an inorganic material such as silicon oxide, silicon nitride, silicon oxynitride, etc. between the two layers.

After preparing the substrate 100, a buffer layer 110 is formed on the substrate 100. The buffer layer 110 may be obtained by depositing an inorganic material such as silicon oxide, silicon nitride, and/or silicon oxynitride on the substrate 100. The buffer layer 110 may be formed by a chemical vapor deposition (CVD) method by using one of the mask frame assemblies described above. Because the buffer layer 110 corresponds to an entire surface of the substrate 100, when a plurality of display apparatuses are simultaneously manufactured by using one mother substrate, a mask included in the mask frame assembly may include large openings corresponding respectively to the display apparatuses, unlike the mask illustrated in FIG. 1, etc. Because the buffer layer 110 may be formed to a space between the display apparatuses, the mask may have an opening corresponding to the opening 10a of the frame 10. The buffer layer 110 may be formed by an atomic layer deposition (ALD) method.

The buffer layer 110 may improve a smoothness of an upper surface of the substrate 100, or may prevent or reduce infiltration of impurities into a semiconductor layer 211 of a thin film transistor 210 from the substrate 100.

The thin film transistor 210 is formed on the buffer layer 110. In detail, the semiconductor layer 211 including amorphous silicon, polycrystalline silicon, or an organic semiconductor material is formed by forming and patterning a semiconductor material layer, and a gate insulating layer 121 including an inorganic material such as silicon oxide, silicon nitride, and/or silicon oxynitride is formed in the same way as that of the buffer layer 110. A conductive layer is formed on the gate insulating layer 121 by using various conductive materials and is patterned to form a gate electrode 213 and lines. Here, the first gate electrode 213 may have various layered structures including various conductive materials, for example, may include a Mo layer and an Al layer. After that, an interlayer insulating layer 131 including an inorganic material such as silicon oxide, silicon nitride, and/or silicon oxynitride is formed to cover the gate electrode 213 in the same way as that of the buffer layer 110. In addition, a conductive layer is formed on the interlayer insulating layer 131 by using various conductive materials and is patterned to form a source electrode 215a, a drain electrode 215b, and lines. The source electrode 215a and the drain electrode 215b may also have various layered structures including various conductive materials, e.g., a Ti layer and an Al layer.

After forming the thin film transistor 210, a planarization layer 140 is formed to cover the thin film transistor 210. The planarization layer 140 may include, for example, an organic material such as acryl, benzocyclobutene (BCB), hexamethyldisiloxane (HMDSO), etc. In FIG. 8, the planarization layer 140 has a single-layered structure, but may be variously modified, e.g., the planarization layer 140 may have a multi-layered structure.

A conductive material layer is formed on the planarization layer 140 by a sputtering method and is patterned to form a pixel electrode 311. In a top-emission type display apparatus that emits light to the outside via an opposite electrode 315, the pixel electrode 311 may include a metal material having high reflectivity, e.g., a stack structure including aluminum and titanium (Ti/Al/Ti), a stack structure of aluminum and ITO (ITO/Al/ITO), an APC alloy, or a stack structure including an APC alloy and ITO (ITO/APC/ITO). The APC alloy is an alloy of argentum (Ag), palladium (Pd), and/or copper (Cu). In a bottom-emission type display apparatus that emits light to the outside via the pixel electrode 311, the pixel electrode 311 may include a transparent conductive material (TCO) such as ITO and IZO that may transmit light, or a semi-transmissive conductive material such as magnesium (Mg), argentum (Ag), or an alloy of magnesium (Mg) and argentum (Ag).

In addition, an insulation material is formed and patterned on the planarization layer 140 to form an opening exposing at least a central portion of the pixel electrode 311, and then, a pixel defining layer 150 is formed. The pixel defining layer 150 may include, for example, an organic material such as polyimide, hexamethyldisiloxane (HMDSO), etc.

After that, an intermediate layer 313 of an organic light-emitting diode 310 is formed by a deposition method using one of the mask frame assemblies described above. The intermediate layer 313 of the organic light-emitting diode 310 may include a low-molecular weight organic material or a polymer material. The intermediate layer 313 may include a single-layered or multi-layered structure including a hole injection layer (HIL), a hole transport layer (HTL), a light-emission layer (EML), an electron transport layer (ETL), an electron injection layer (EIL), etc. However, the intermediate layer 313 is not limited thereto, but may have various structures. In addition, the intermediate layer 313 may include a layer formed integrally over the plurality of pixel electrodes 311 or may include a layer that is patterned to correspond to each of the plurality of pixel electrodes 311. The layers of various shapes may be easily obtained by changing a shape of a slit or an opening in the mask included in the mask frame assembly.

The opposite electrode 315 may be formed by a sputtering method, etc. The opposite electrode 315 may be integrally provided over the plurality of organic light-emitting diodes to correspond to a plurality of pixel electrodes 311. In the top-emission type display apparatus, the opposite electrode 315 may include a transparent conductive material (TCO) such as ITO and IZO that may transmit the light, or a semi-transmissive conductive material such as magnesium (Mg), argentum (Ag), or an alloy of magnesium (Mg) and argentum (Ag). In the bottom-emission type display apparatus, the opposite electrode 315 may include a metal material having a high reflectivity, such as a stack structure including aluminum and titanium (Ti/Al/Ti), a stack structure of aluminum and ITO (ITO/Al/ITO), an APC alloy, and a stack structure of an APC alloy and ITO (ITO/APC/ITO). The APC alloy is an alloy of argentum (Ag), palladium (Pd), and/or copper (Cu).

Because the organic light-emitting diode 310 may be easily damaged by external moisture or oxygen, an encapsulation layer 160 covering the organic light-emitting diode 310 may be formed. The encapsulation layer 160 may include a first inorganic encapsulation layer 161, an organic encapsulation layer 163, and a second inorganic encapsulation layer 165. In addition, a $\lambda/4$ wave plate 181 and/or a linear polarization plate 183 may be formed on the encapsulation layer 160.

When the organic light-emitting display apparatus is manufactured as above, one of the mask frame assemblies according to the one or more embodiments may be used to form various layers, in particular, the intermediate layer 313. Because the deformation of the frame 10 during using the mask frame assembly may be prevented or reduced, generation of defects during the manufacturing processes of the organic light-emitting display apparatus may be effectively prevented.

According to one or more embodiments, the mask frame assembly in which deformation of the frame may be reduced and the method of manufacturing the organic light-emitting display apparatus using the mask frame assembly may be implemented. However, the scope of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A mask frame assembly comprising:
a frame of a rectangular shape, the frame including an opening and a lower surface, the lower surface including first grooves defined in the lower surface and extending in a first direction;
a plurality of first auxiliary sticks extending in the first direction across the opening, wherein a first end and a second end of each of the first auxiliary sticks are bonded to an upper surface of the frame;
a mask disposed over the plurality of first auxiliary sticks; and
a plurality of second auxiliary sticks disposed in the first grooves, wherein a third end and a fourth end of each of the plurality of second auxiliary sticks are bonded to a bottom surface of the first grooves,
wherein the number of the plurality of first auxiliary sticks is greater than the number of the plurality of second auxiliary sticks, and a thickness of each of the plurality of second auxiliary sticks is greater than a thickness of each of the plurality of first auxiliary sticks,
wherein the frame has second grooves defined in the lower surface thereof, the second grooves extending in a second direction that crosses the first direction, and
the mask frame assembly further comprising: a plurality of third auxiliary sticks extending in the second direction across the opening, wherein a fifth end and a sixth end of each of the third auxiliary sticks are bonded to the upper surface of the frame; and
a plurality of fourth auxiliary sticks in the second grooves, wherein a seventh end and an eighth end of each of the plurality of fourth auxiliary sticks are bonded to a bottom surface of the second grooves,
wherein the plurality of first auxiliary sticks and the plurality of third auxiliary sticks are bonded to each other at intersecting points therebetween.

2. The mask frame assembly of claim 1, wherein a depth of each of the first grooves is greater than a thickness of each of the plurality of second auxiliary sticks.

3. The mask frame assembly of claim 1, wherein the number of the plurality of first auxiliary sticks is greater than the number of the plurality of second auxiliary sticks, and a width of each of the plurality of second auxiliary sticks is greater than a width of each of the plurality of first auxiliary sticks.

4. The mask frame assembly of claim 1, wherein the number of the plurality of first auxiliary sticks is greater than the number of the first grooves, and two or more second auxiliary sticks among the plurality of second auxiliary sticks are stacked in each of the first grooves.

5. The mask frame assembly of claim 1, wherein the first end and the second end of each of the plurality of first auxiliary sticks are bonded to the upper surface of the frame in a state in which a tensile force is applied to each of the plurality of first auxiliary sticks,
the third end and the fourth end of each of the plurality of second auxiliary sticks are bonded to the bottom surface of the first grooves in a state in which a tensile force is applied to each of the plurality of second auxiliary sticks,
the number of the plurality of first auxiliary sticks is greater than the number of the plurality of second auxiliary sticks, and
the tensile force applied to each of the plurality of second auxiliary sticks is greater than the tensile force applied to each of the plurality of first auxiliary sticks.

6. The mask frame assembly of claim 1, wherein the mask comprises a plurality of mask sticks extending in a second direction that crosses the first direction.

7. The mask frame assembly of claim 1, wherein a depth of each of the second grooves is greater than a thickness of each of the plurality of fourth auxiliary sticks.

8. The mask frame assembly of claim 1, wherein the number of the plurality of third auxiliary sticks is greater than the number of the plurality of fourth auxiliary sticks, and a width of each of the plurality of fourth auxiliary sticks is greater than a width of each of the plurality of third auxiliary sticks.

9. The mask frame assembly of claim 1, wherein the number of the plurality of third auxiliary sticks is greater than the number of the plurality of fourth auxiliary sticks, and a thickness of each of the plurality of fourth auxiliary sticks is greater than a thickness of each of the plurality of third auxiliary sticks.

10. The mask frame assembly of claim 1, wherein the number of the plurality of third auxiliary sticks is greater than the number of the second grooves, and two or more fourth auxiliary sticks among the plurality of fourth auxiliary sticks are stacked in each of the second grooves.

11. The mask frame assembly of claim 1, wherein the opening has a rectangular shape having long sides and short sides, and the first direction is parallel with the long sides of the opening.

* * * * *